United States Patent
Sasaki

(10) Patent No.: US 9,496,093 B2
(45) Date of Patent: Nov. 15, 2016

(54) DYE-SENSITIZED SOLAR CELL

(75) Inventor: Miho Sasaki, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 453 days.

(21) Appl. No.: 13/072,956

(22) Filed: Mar. 28, 2011

(65) Prior Publication Data

US 2011/0240087 A1    Oct. 6, 2011

(30) Foreign Application Priority Data

Mar. 30, 2010  (JP) .................. 2010-079178

(51) Int. Cl.
*H01G 9/20* (2006.01)
*H01L 51/00* (2006.01)

(52) U.S. Cl.
CPC .......... *H01G 9/2013* (2013.01); *H01G 9/2031* (2013.01); *H01G 9/2059* (2013.01); *H01G 9/2095* (2013.01); *H01L 51/0037* (2013.01); *H01L 51/0086* (2013.01);
(Continued)

(58) Field of Classification Search
CPC ..... H01G 9/2059; H01G 9/20; Y02E 10/542
See application file for complete search history.

(56) References Cited

U.S. PATENT DOCUMENTS

| 3,668,089 | A * | 6/1972 | Chase et al. | .............. 216/95 |
| 2006/0174932 | A1 | 8/2006 | Usui et al. | |
| 2008/0115831 | A1* | 5/2008 | Kang et al. | ............ 136/263 |

(Continued)

FOREIGN PATENT DOCUMENTS

| JP | 2003-157914 A | 5/2003 |
| JP | 2005-019132 A | 1/2005 |

(Continued)

OTHER PUBLICATIONS

Translation of Sasaki et al., JP 2010-033825 A, provided by AIPN Gazette.*

(Continued)

*Primary Examiner* — Jennifer K. Michener
*Assistant Examiner* — Magali P Slawski
(74) *Attorney, Agent, or Firm* — Ladas & Parry LLP

(57) ABSTRACT

A main object of the present invention is to provide a dye-sensitized solar cell capable of improving photoelectric conversion efficiency, which is obtained at low costs, and a dye-sensitized solar cell module using the solar cell. The present invention solves the problem by providing a dye-sensitized solar cell comprising: an oxide semiconductor electrode substrate having: a first electrode base material provided with a function as an electrode, and a porous layer formed on the first electrode base material and containing a dye-sensitizer-supported fine particle of a metal oxide semiconductor; and a counter substrate having a second electrode base material provided with a function as an electrode; and a polymer electrolyte layer formed between the oxide semiconductor electrode substrate and the counter substrate so as to contact with the porous layer, in which the oxide semiconductor electrode substrate and the counter substrate are disposed such that the porous layer and the second electrode base material are opposed to each other, wherein at least one of the first electrode base material and the second electrode base material is a base material having transparency and wherein the polymer electrolyte layer contains a transparent fine particle, a polymeric compound and a redox pair.

3 Claims, 2 Drawing Sheets

(52) U.S. Cl.
CPC ....... *H01L 2251/308* (2013.01); *Y02E 10/542* (2013.01); *Y02P 70/521* (2015.11)

(56) References Cited

U.S. PATENT DOCUMENTS

| | | | | |
|---|---|---|---|---|
| 2008/0245410 | A1* | 10/2008 | Duerr et al. ................. | 136/256 |
| 2009/0223703 | A1* | 9/2009 | Winoto ......................... | 174/257 |
| 2010/0229950 | A1* | 9/2010 | Kuang et al. ................ | 136/263 |

FOREIGN PATENT DOCUMENTS

| | | | |
|---|---|---|---|
| JP | 2009193705 A | * | 8/2009 |
| JP | 2009-238571 A | | 10/2009 |
| JP | 2010033815 A | * | 2/2010 |
| WO | 2005/006482 A1 | | 1/2005 |

OTHER PUBLICATIONS

Han et al. "A hybrid poly(ethylene oxide)/poly(vinylidene fluoride)/TiO2 nanoparticle solid-state redox electrolyte for dye-sensitized nanocrystalline solar cells" Adv. Funct. Mater. 2005, 15, 1940-1944.*

Ohno et al. "Morphology of a TiO2 photocatalyst (Degussa, P-25) consisting of anatase and rutile crystalline phases" Journal of Catalysis, 203, 82-86 (2001).*

Hanaor et al. "Morphology and photocatalytic activity of highly oriented mixd phase titanium dioxide thin films" Surface & Coatings Technology 205 (2011) 3658-3664.*

Powell et al. "Thermal conductivity of selected materials" National Bureau of Standards, National Standard Reference Data System, issued 1966, figure 23 and table 23 (not fully paginated).*

Earle "The electrical conductivity of titanium dioxide" Physical Review, vol. 61, Jan. 1942, pp. 56-62.*

Kalamazoo Paper Chemicals "Titanium Dioxide" at www.kalpaperchem.com/titan.htm, retrieved Aug. 4, 2012, pp. 1-3.*

Ingham et al. "Refractive index-molecular weight relationship for poly(ethylene oxide)" Journal of Polymer Science Part A: General Papers, vol. 3 issue 7, pp. 2707-2710, Jul. 1965.*

Fluorotherm "PVDF Properties and Characteristics" at fluorotherm.com/Properties-PDVF.asp, retrieved Aug. 4, 2012.*

Song et al. "Characterization of UV-cured gel polymer electrolytes for rechargeable lithium batteries" Journal of Power Sources, 110 (2002) 209-215.*

Yaksr "Titanium Dioxide" www.yaksr.com/titanium-dioxide.html, retrieved Jun. 16, 2013.*

Polyanskiy, M. Refractive index database, http://refractiveindex.info. Accessed Sep. 19, 2014.*

Sigma-Aldrich. http://www.sigmaaldrich.com/catalog/product/aldrich/202487?lang=en&region=US, retrieved Sep. 19, 2014.*

Translation of Yabuuchi, JP 2009193705 A.*

* cited by examiner

DYE-SENSITIZED SOLAR CELL

BACKGROUND OF THE INVENTION

Field of the Invention

The present invention relates to a high-quality dye-sensitized solar cell with high photoelectric conversion efficiency, which is obtained at low costs.

Description of the Related Art

In recent years, an environmental issue such as global warming, resulting from the increase of carbon dioxide, has become so serious that measures thereagainst have been promoted on a worldwide basis. Above all, active research and development on a solar cell utilizing solar light energy have been promoted as a clean energy source with fewer burdens on the environment. A monocrystal silicon solar cell, a polycrystalline silicon solar cell, an amorphous silicon solar cell and a compound semiconductor solar cell, and the like have been already put to practical use as such a solar cell, but yet the problem is that these solar cells require high production costs. Thus, a dye-sensitized solar cell has been receiving attentions, researched and developed as a solar cell with fewer environmental burdens, which may decrease production costs.

FIGS. 4A and 4B are each a schematic cross-sectional view showing an example of a general dye-sensitized solar cell. As shown in FIG. 4A, a general dye-sensitized solar cell 100 comprises: an oxide semiconductor electrode substrate 110 having: a first electrode base material 111 having a transparent base material 111b and a transparent electrode layer 111a formed on the transparent base material 111b, and a porous layer 112 formed on the transparent electrode layer 111a and containing a dye-sensitizer-supported fine particle of a metal oxide semiconductor; a counter substrate 120 having: a second electrode base material 121 provided with a function as an electrode, and a catalyst layer 122 formed on the second electrode base material 121; an electrolyte layer 130 formed between the oxide semiconductor electrode substrate 110 and the counter substrate 120 so as to contact with the porous layer 112; and a sealing agent 140 for sealing the dye-sensitized solar cell 100. Then, the dye sensitizer adsorbed in a surface of the fine particle of a metal oxide semiconductor in the porous layer 112 is excited by receiving solar light from the oxide semiconductor electrode substrate 110 side, and an excited electron is conducted to the transparent electrode layer 111a and conducted to the second electrode base material 121 through an external circuit. Thereafter, the returning of the electron to a ground level of the dye sensitizer through a redox pair causes electric power generation.

FIG. 4A is showing as an example a dye-sensitized solar cell of the so-called 'sequential structure cell type' such that the first electrode base material 111 has transparency and solar light is received from the oxide semiconductor electrode substrate 110 side. Also, a dye-sensitized solar cell having a constitution of the so-called 'inverse structure cell type' such that the second electrode base material 121 has transparency and solar light is received from the counter substrate 120 side is known as exemplified in FIG. 4B. In FIG. 4B, the second electrode base material 121 has a transparent base material 121b and a transparent electrode layer 121a formed on the transparent base material 121b, and the first electrode base material 111 does not have transparency.

Although not shown in the drawing, the above-mentioned dye-sensitized solar cell occasionally has a constitution such that the first electrode base material and the second electrode base material are each base materials having transparency and solar light may be received from either the oxide semiconductor electrode substrate side or the counter substrate side.

Here, in the case of using a liquid electrolyte layer as the above-mentioned electrolyte layer, the sealing needs to be strictly performed by the sealing agent, and the like for preventing liquid spill from the liquid electrolyte layer, however, there has been a problem in durability and stability to maintain the sealing state over a long period since inconveniences such as evaporation of a solvent molecule and solvent disappearance due to liquid spill are occasionally caused.

Since a certain film thickness is necessary for the above-mentioned sealing agent and a certain thickness is also necessary for the electrolyte layer in order to seal the above-mentioned dye-sensitized solar cell, there has been a problem that the dye-sensitized solar cell is formed into a thin film with difficulty.

Thus, it has been studied that a polymer electrolyte layer solidified by making the electrolyte layer contain a polymeric compound is used as the above-mentioned electrolyte layer (Japanese Patent Application Publication No. 2005-019132). In the case of using the above-mentioned polymer electrolyte layer, liquid spill and the like may be restrained from occurring and the polymer electrolyte layer may be formed into a thin film by reason of not requiring the above-mentioned sealing agent.

However, also it is difficult for the above-mentioned polymer electrolyte layer containing only the polymeric compound to sufficiently retain the above-mentioned redox pair, and in a severe use environment of the dye-sensitized solar cell, a problem such that leakage of the redox pair from the above-mentioned polymer electrolyte layer is occasionally caused to deteriorate the dye-sensitized solar cell has been occurred.

The further improvement of photoelectric conversion efficiency has been demanded for the above-mentioned dye-sensitized solar cell and a method for effectively utilizing solar light received by the above-mentioned dye-sensitized solar cell has been studied.

[Patent Document]
[Document 1] Japanese Patent Application Publication No. 2005-019132

SUMMARY OF THE INVENTION

The main object of the present invention is to provide a dye-sensitized solar cell capable of improving photoelectric conversion efficiency, which is obtained at low costs, and a dye-sensitized solar cell module using the solar call.

To solve the above problem, the present invention provides a dye-sensitized solar cell comprising: an oxide semiconductor electrode substrate having: a first electrode base material provided with a function as an electrode, and a porous layer formed on said first electrode base material and containing a dye-sensitizer-supported fine particle of a metal oxide semiconductor; a counter substrate having a second electrode base material provided with a function as an electrode; and a polymer electrolyte layer formed between said oxide semiconductor electrode substrate and said counter substrate so as to contact with said porous layer, in which said oxide semiconductor electrode substrate and said counter substrate are disposed such that said porous layer and said second electrode base material are opposed to each other, wherein at least one of said first electrode base material and said second electrode base material is a base material having transparency; and wherein said polymer electrolyte layer contains a transparent fine particle, a polymeric compound and a redox pair.

According to the present invention, the above-mentioned polymer electrolyte layer contains a transparent fine particle and a polymeric compound, so that leakage of the redox pair from the above-mentioned polymer electrolyte layer may be restrained from occurring under high-temperature atmosphere. The above-mentioned polymer electrolyte layer contains a transparent fine particle, so that the polymer electrolyte layer may be rendered high in transparency, and a dye sensitizer in the above-mentioned porous layer absorbs solar light so easily that a dye-sensitized solar cell with high photoelectric conversion efficiency is obtained.

In addition, the above-mentioned polymer electrolyte layer contains a transparent fine particle, so that the light scattering function may be provided for the above-mentioned polymer electrolyte layer and solar light may be effectively utilized; therefore, a dye-sensitized solar cell with high photoelectric conversion efficiency is also obtained.

In the present invention, the above-mentioned transparent fine particle preferably has conductivity. The above-mentioned transparent fine particle has conductivity, so that transfer efficiency of electric charge in the above-mentioned polymer electrolyte layer may be improved; therefore, a dye-sensitized solar cell with high power generation efficiency is obtained.

In the present invention, it is preferable that refractive index of the above-mentioned transparent fine particle differs from that of the above-mentioned polymeric compound. Thus, so higher light scattering function may be provided for the above-mentioned polymer electrolyte layer that solar light may be effectively utilized.

In the present invention, it is preferable that transparency of the above-mentioned transparent fine particle is higher than that of the above-mentioned polymeric compound. Thus, transparency of the above-mentioned polymer electrolyte layer may be further improved.

In the present invention, it is preferable that at least the above-mentioned second electrode base material is a base material having transparency. In the present invention, the above-mentioned polymer electrolyte layer is so excellent in transparency that light entering from the above-mentioned second electrode base material side may be transmitted through the above-mentioned polymer electrolyte layer and favorably absorbed in a dye sensitizer in the porous layer. Thus, in the present invention, the effect by excellent transparency and light scattering function of the above-mentioned polymer electrolyte layer may be further performed.

The present invention provides a dye-sensitized solar cell module comprising a plurality of a dye-sensitized solar cell connected, wherein each dye-sensitized solar cell comprises: an oxide semiconductor electrode substrate having: a first electrode base material provided with a function as an electrode, and a porous layer formed on said first electrode base material and containing a dye-sensitizer-supported fine particle of a metal oxide semiconductor; a counter substrate having a second electrode base material provided with a function as an electrode!; and a polymer electrolyte layer formed between said oxide semiconductor electrode substrate and said counter substrate so as to contact with said porous layer, in which said oxide semiconductor electrode substrate and said counter substrate are disposed such that said porous layer and said second electrode base material are opposed to each other, wherein at least one of said first electrode base material and said second electrode base material is a base material having transparency; and said polymer electrolyte layer contains a transparent fine particle, a polymeric compound and a redox pair.

According to the present invention, the above-mentioned dye-sensitized solar cell allows a high-quality dye-sensitized solar cell module which is obtained at low costs.

According to the present invention, the above-mentioned polymer electrolyte layer contains the above-mentioned transparent fine particle and polymeric compound, so that leakage of the redox pair from the above-mentioned polymer electrolyte layer may be restrained under high-temperature atmosphere; therefore, a high-quality dye-sensitized solar cell may be provided.

Also, according to the present invention, the above-mentioned polymer electrolyte layer contains the above-mentioned transparent fine particle, so that the above-mentioned polymer electrolyte layer may improve transparency and have the light scattering function; therefore, a dye-sensitized solar cell with high photoelectric conversion efficiency may be obtained.

DESCRIPTION OF THE PREFERRED EMBODIMENT

Figure 1:
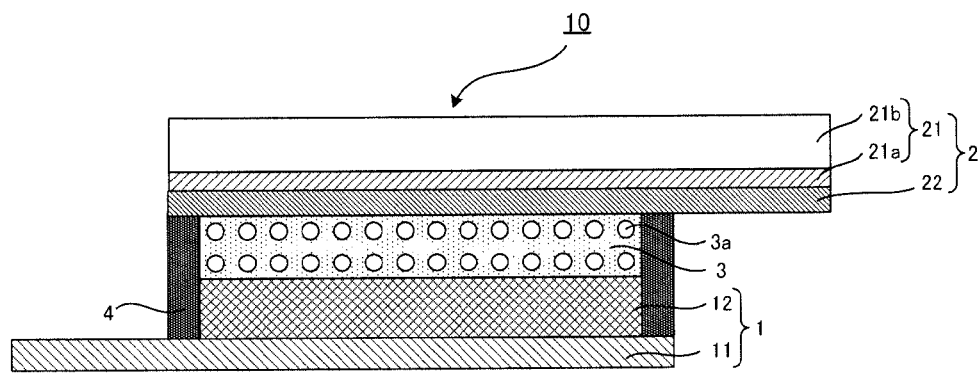
FIG. 1 is a schematic cross-sectional view showing an example of a dye-sensitized solar cell of the present invention.

A dye-sensitized solar cell and a dye-sensitized solar cell module of the present invention are hereinafter described in detail.

A. Dye-Sensitized Solar Cell

First, a dye-sensitized solar cell of the present invention is described.

The dye-sensitized solar cell of the present invention comprises: an oxide semiconductor electrode substrate having: a first electrode base material provided with a function as an electrode, and a porous layer formed on the above-mentioned first electrode base material and containing a dye-sensitizer-supported fine particle of a metal oxide semiconductor; a counter substrate having a second electrode base material provided with a function as an electrode; and a polymer electrolyte layer formed between the oxide semiconductor electrode substrate and the counter substrate so as to contact with the porous layer, in which the oxide semiconductor electrode substrate and the counter substrate are disposed such that the porous layer and the second electrode base material are opposed to each other, wherein at least one of the first electrode base material and the second electrode base material is a base material having transparency, and wherein the polymer electrolyte layer contains a transparent fine particle, a polymeric compound and a redox pair.

Here, the polymer electrolyte layer in the present invention contains a transparent fine particle, a polymeric compound and a redox pair, and exhibits no flowability.

Next, a dye-sensitized solar cell of the present invention is described by using the drawing.

FIG. 1 is a schematic cross-sectional view showing an example of a dye-sensitized solar cell of the present invention. As shown in FIG. 1, a dye-sensitized solar cell 10 of the present invention comprises: an oxide semiconductor electrode substrate 1 having: a first electrode base material 11 made of a metallic foil, and a porous layer 12 formed on the first electrode base material 11 and containing a dye-sensitizer-supported fine particle of a metal oxide semiconductor; a counter substrate 2 having: a second electrode base material 21 having a transparent base material 21b and a transparent electrode layer 21a formed on the transparent base material 21b, and a catalyst layer 22 formed on the transparent electrode layer 21a; and a polymer electrolyte layer 3 formed between the oxide semiconductor electrode substrate 1 and the counter substrate 2 so as to contact with the porous layer 12, in which the oxide semiconductor electrode substrate 1 and the counter substrate 2 are disposed such that the porous layer 12 and the catalyst layer 22 are opposed to each other. Also, as shown in FIG. 1, in the present invention, the polymer electrolyte layer 3 contains a transparent fine particle 3a, a polymeric compound and a redox pair.

Figure 2:
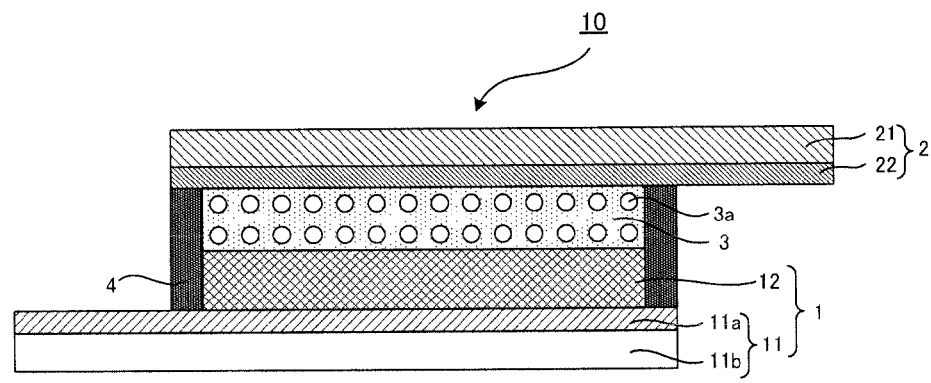
FIG. 2 is a schematic cross-sectional view showing another example of the dye-sensitized solar cell of the present invention.

In the present invention, as shown in FIG. 2, the first electrode base material 11 may be a base material having transparency and the second electrode base material 21 may be a base material having no transparency. FIG. 2 is showing an example such that the first electrode base material 11 is composed of a transparent base material 11b and a transparent electrode layer 11a formed on the transparent base material 11b, and the second electrode base material 21 is made of a metallic foil. The reference numerals not described in FIG. 2 may be the same as those in FIG. 1; therefore, the description herein is omitted.

Although not shown in FIG., in the present invention, both the above-mentioned first electrode base material and second electrode base material may be a base material having transparency.

According to the present invention, the above-mentioned polymer electrolyte layer contains the polymeric compound and the transparent fine particle, so that leakage of the redox pair from the above-mentioned polymer electrolyte layer may be restrained under high-temperature atmosphere, and a high-quality dye-sensitized solar cell with less deterioration over time is allowed. Necessary processes for producing the dye-sensitized solar cell of the present invention are performed under the above-mentioned high-temperature atmosphere, so that it is necessary that leakage of the redox pair from the above-mentioned polymer electrolyte layer be restrained under the above-mentioned high-temperature atmosphere.

Here, the high-temperature atmosphere is not particularly limited if it is a temperature at which the dye-sensitized solar cell of the present invention may be produced or used, but specifically signifies a range of 100° C. to 150° C.

According to the present invention, the above-mentioned polymer electrolyte layer contains the transparent fine particle, so that transparency of the polymer electrolyte layer may be improved.

For example, in the case where solar light is received from the counter substrate side, light entering from the counter substrate side is transmitted through the polymer electrolyte layer and absorbed in a dye sensitizer in the above-mentioned porous layer. In the present invention, the polymer electrolyte layer may be rendered so excellent in transmission of solar light that solar light may be sufficiently absorbed in the dye sensitizer, and a dye-sensitized solar cell with high photoelectric conversion efficiency is obtained.

On the other hand, in the case where solar light is received from the oxide semiconductor electrode substrate side, light entering from the oxide semiconductor electrode substrate side is directly irradiated and absorbed in a dye sensitizer in the porous layer. Here, the porous layer is composed of such a porous body that a dye-sensitized solar cell using the polymer electrolyte layer usually has a constitution such that the polymer electrolyte layer material enters pores of the porous layer. Then, in the case where the above-mentioned polymer electrolyte layer is inferior in transparency, a possibility of hindering light irradiated on the above-mentioned dye sensitizer is conceived.

In the present invention, the above-mentioned polymer electrolyte layer is so excellent in transparency that solar light may be sufficiently absorbed in the dye sensitizer, and a dye-sensitized solar cell with high photoelectric conversion efficiency is obtained.

Also, according to the present invention, the above-mentioned polymer electrolyte layer contains the transparent fine particle, so that the light scattering function may be provided for the polymer electrolyte layer.

Therefore, light entering the polymer electrolyte layer may be scattered, so that incident light of solar light may be effectively utilized.

In the present invention, in the case where one of the above-mentioned first electrode base material and the above-mentioned second electrode base material is made of a metallic foil having no transparency, light entering from the other base material side having transparency is reflected by the specular effect of the above-mentioned metallic foil. In the present invention, this reflected light may be also scattered by the polymer electrolyte layer, so that reflected light of solar light may be also utilized effectively.

Accordingly, in the present invention, the above-mentioned polymer electrolyte layer has the light scattering function, so that solar light may be effectively utilized.

Each member used for a dye-sensitized solar cell of the present invention is hereinafter described.

1. Polymer Electrolyte Layer

The polymer electrolyte layer used for the present invention is formed between the after-mentioned oxide semiconductor electrode substrate and counter substrate so as to contact with the after-mentioned porous layer.

As described above, the above-mentioned polymer electrolyte layer contains a transparent fine particle, a polymeric compound and a redox pair, and exhibits no flowability.

Here, generally, examples of a method for forming the polymer electrolyte layer include a method for solidifying a redox pair by a polymeric compound (chemical gelatinization method) and a method for decreasing flowability by adding titanium oxide particles, silica particles, and the like to an electrolytic solution used for a general solar cell (physical gelatinization method). The polymer electrolyte layer in the present invention is formed by the chemical gelatinization method and does not include a polymer electrolyte layer formed by the physical gelatinization method.

Also, here, 'exhibits no flowability' signifies no exhibition of flowability in the case of producing or using the above-mentioned dye-sensitized solar cell, more specifically, no exhibition of flowability even in the case of pressurizing the above-mentioned polymer electrolyte layer and the case of being under the above-mentioned high-temperature atmosphere.

Each is described hereinafter.

(1) Transparent Fine Particle

First, the transparent fine particle used for the above-mentioned polymer electrolyte layer is described.

The average particle diameter of the transparent fine particle used for the above-mentioned polymer electrolyte layer is preferably within a range of 1 nm to 10 μm, above all within a range of 5 nm to 1 μm, and particularly within a range of 15 nm to 500 nm. The reason therefor is that in the case where the average particle diameter of the transparent fine particle is less than the above-mentioned range, even though the transparent fine particle is contained in the above-mentioned polymer electrolyte layer, there is a possibility that leakage of the redox pair from the polymer electrolyte layer may not sufficiently be restrained. Also, there is a possibility that sufficient light scattering function may not be provided for the polymer electrolyte layer. Further, in the case where the average particle diameter of the transparent fine particle is more than the above-mentioned range, there is a possibility that the polymer electrolyte layer in which the transparent fine particle is dispersed may not be formed. Also, there is a possibility that the film thickness of the polymer electrolyte layer may not be stabilized.

Here, average particle diameter is generally used for denoting granularity of particles, and is a value measured by a laser method in the present invention. The laser method is a method such that particles are dispersed into solvent, and scattered light obtained by irradiating the dispersion solvent with laser beams is thinned and computed to thereby measure average particle diameter and particle size distribution. The above-mentioned average particle diameter is a value measured by using the particle size analyzer MICROTRACK UPA Model-9230™ manufactured by Leeds and Northrup Co. uk as a particle size measuring instrument for the laser method.

Examples of a shape of the above-mentioned transparent fine particle include a spherical shape and a needle shape.

The transparency of the transparent fine particle is such that transmittance of light with a wavelength of 400 nm to 800 nm is preferably 70% or more, and more preferably 80% or more. The reason therefor is that solar light may be favorably transmitted through the above-mentioned polymer electrolyte layer.

The transparency of the transparent fine particle is preferably higher than the transparency of the after-mentioned polymeric compound. Thus, entire light transmittance and diffuse light transmittance of the polymer electrolyte layer may be improved.

The transparency of the transparent fine particle is a value measured by a measuring method in conformity to JIS K7361-1:1997 and a measuring method for measuring transmittance of the transparent fine particle by using an ultraviolet-visible-near-infrared spectrophotometer UV-3600.

With regard to the transparent fine particle used for the present invention, it is preferable that refractive index of the transparent fine particle differs from that of the above-mentioned polymeric compound, and that refractive index difference between refractive index of the transparent fine particle and that of the polymeric compound becomes larger. The reason therefor is that larger refractive index difference between the two may provide higher light scattering function for the above-mentioned polymer electrolyte layer.

The refractive index difference between refractive index of the transparent fine particle and that of the after-mentioned polymeric compound is not particularly limited if it is such refractive index difference as may provide the light scattering function for the above-mentioned polymer electrolyte layer.

The refractive index of the above-mentioned transparent fine particle is preferably within a range of 1.0 to 3.0, above all within a range of 1.3 to 2.5, and particularly within a range of 1.4 to 2.3. The reason therefor is that in the case where refractive index of the above-mentioned transparent fine particle is less than the above-mentioned range, the light scattering function is provided for the above-mentioned polymer electrolyte layer with difficulty. Also, in the case where refractive index of the transparent fine particle is more than the above-mentioned range, the transparent fine particle is formed with difficulty.

The above-mentioned refractive index is calculated on the basis of a value obtained by measuring refractive index of the above-mentioned transparent fine particle while using the refractometer KPR-200™ manufactured by KALNEW CO., LTD., the refractometer PR-2™ manufactured by CARL ZEISS JENA, and the Abbe refractometer NAR-1T SOLID™ manufactured by ATAGO CO., LTD.

The content of the transparent fine particle in a solid component of the above-mentioned polymer electrolyte layer is preferably within a range of 0.1% by mass to 90% by mass, above all within a range of 1% by mass to 50% by mass, and particularly within a range of 3% by mass to 30% by mass. The reason therefor is that in the case where the content of the transparent fine particle is less than the above-mentioned range, even though the transparent fine particle is contained in the above-mentioned polymer electrolyte layer, leakage of the redox pair from the above-mentioned polymer electrolyte layer is restrained with difficulty. Also, it is difficult to improve the transparency of the polymer electrolyte layer and to provide the light scattering function. The reason therefor is that in the case where the content of the transparent fine particle is more than the above-mentioned range, the above-mentioned polymer electrolyte layer is formed with difficulty.

The transparent fine particle used for the present invention may have conductivity or no conductivity. In the present invention, above all, the transparent fine particle preferably has conductivity. The reason therefor is that if the transparent fine particle has conductivity, transfer efficiency of electric charge in the above-mentioned polymer electrolyte layer may be improved; therefore, the dye-sensitized solar cell of the present invention may be rendered excellent in power generation efficiency.

Examples of a conductive material used for such a transparent fine particle include conductive metal oxides and conductive polymeric compound. As examples of the conductive metal oxides, tin oxide-based materials such as tin oxide ($SnO_2$), indium-tin oxide (ITO) and fluorine-doped tin oxide (FTO), zinc oxide-based materials such as zinc oxide (ZnO) and a compound obtained by doping zinc oxide into indium oxide (IZO), and antimony oxide-based materials such as antimony trioxide (ATO) are cited. As examples of the conductive polymeric compound, polythiophene, polyaniline (PA), polypyrrole, polyethylene dioxythiophene (PEDOT) and derivatives thereof are cited.

In the case where the above-mentioned transparent fine particle has no conductivity, examples of a material for the transparent fine particle include inorganic oxide particles such as silica, alumina and glass, and resin particles.

(2) Polymeric Compound

Next, the polymeric compound used for the above-mentioned polymer electrolyte layer is described.

Preferable examples of the polymeric compound in the above-mentioned polymer electrolyte layer include a polymeric compound having, as a main chain, polyether, polymethacrylic acid, polyacrylic acid alkyl ester, polymethacrylic acid alkyl ester, polycaprolactone, polyhexamethylene carbonate, polysiloxane, polyethylene oxide, polypropylene oxide, polyacrylic nitrile, polyvinylidene fluoride, polyvinyl fluoride, polyhexafluoropropylene, polyfluoroethylene, polyethylene, polypropylene, polystyrene and polyacrylonitrile, and a copolymer of two kinds or more of these monomer components.

Examples of the polymeric compound used for the above-mentioned polymer electrolyte layer include cellulosic resin. The cellulosic resin is so high in heat resistance that the electrolyte layer solidified by the cellulosic resin causes no liquid spill even under high temperature and is high in thermal stability. Specific examples thereof include cellulose acetates (CA) such as cellulose, cellulose acetate, cellulose diacetate and cellulose triacetate; cellulose esters such as cellulose acetate butyrate (CAB), cellulose acetate propionate (CAP), cellulose acetate phthalate and cellulose nitrate; and cellulose ethers such as methyl cellulose, ethyl cellulose, benzyl cellulose, cyanoethyl cellulose, hydroxymethyl cellulose, hydroxyethyl cellulose, hydroxypropyl cellulose, hydroxypropyl methyl cellulose and carboxymethyl cellulose. With regard to these cellulosic resins, any may be used singly or two kinds or more may be used by mixture.

Among the cellulosic resins, a cationic cellulose derivative is used particularly preferably from the viewpoint of compatibility with an electrolytic solution. The cationic cellulose derivative signifies such as to be cationized by reacting an OH group of cellulose or a derivative thereof with a cationization agent. The inclusion of the cationic cellulose derivative provides the polymer electrolyte layer which is excellent in retention of the liquid electrolyte, offers no liquid spill of the liquid electrolyte particularly under high temperature or during pressurization, and is excellent in thermal stability.

The molecular weight of the above-mentioned cellulosic resin varies with kinds of the cellulosic resin and not particularly limited; from the viewpoint of obtaining favorable film-forming property in the case of forming the electrolyte layer, the mass-average molecular weight is preferably 10,000 or more (in terms of polystyrene), particularly within a range of 100,000 to 200,000. For example, in the case of using ethyl cellulose as the cellulosic resin, such a molecular weight as exhibits a viscosity within a range of 5 mPa·s to 1000 mPa·s, particularly, within a range of 10 mPa·s to 500 mPa·s is preferable with regard to use in the case of dissolving ethyl cellulose in water by 2% by mass to measure a viscosity at a temperature of 30° C.

The glass transition temperature of the cellulosic resin is preferably within a range of 80° C. to 150° C. for obtaining a sufficient thermal stability of the electrolyte layer.

The polymeric compound used for the present invention preferably has transparency. The polymeric compound has transparency, so that transparency of the above-mentioned polymer electrolyte layer may be further improved. The appearance of the dye-sensitized solar cell of the present invention may be rendered favorable by improving transparency of the above-mentioned polymer electrolyte layer. In the case where the above-mentioned polymer electrolyte layer infiltrates into the porous layer, the polymer electrolyte layer may be prevented from intercepting light, so that the performance of the dye-sensitized solar cell of the present invention may be improved.

The content of such a polymeric compound is properly determined in consideration of such that too low content deteriorates thermal stability of the polymer electrolyte layer while too high content deteriorates photoelectric conversion efficiency of the solar cell. Specifically, the polymeric compound is preferably contained by 5% by mass to 60% by mass in the polymer electrolyte layer. In the case where the ratio of the polymeric compound in the polymer electrolyte layer is less than the above-mentioned range, it is not preferable that occasionally the adhesion properties to the after-mentioned porous layer is not sufficiently obtained to lead to a deterioration in mechanical strength of the polymer electrolyte layer itself. On the other hand, in the case where the ratio thereof is more than the above-mentioned range, it is not preferable that the polymeric compound with insulation properties exists in so large quantities as to bring a possibility of hindering the function of transporting electric charge.

(3) Redox Pair

Next, the redox pair used for the present invention is described.

In the polymer electrolyte layer used for the present invention, the redox pair is not particularly limited if it is generally used in an electrolyte layer of a dye-sensitized solar cell. Specifically, a combination of iodine and iodide and a combination of bromine and bromide are preferable. Examples of the combination of iodine and iodide include a combination of metal iodide such as LiI, NaI, KI and $CaI_2$ and $I_2$. In addition, examples of the combination of bromine and bromide include a combination of metal bromide such as LiBr, NaBr, KBr and $CaBr_2$ and $Br_2$.

With regard to the content of the redox pair, the ratio of the redox pair occupied in the polymer electrolyte layer is preferably within a range of 1% by mass to 50% by mass, above all within a range of 5% by mass to 35% by mass.

(4) Other Components

Necessary components other than the above-mentioned transparent fine particle, polymeric compound and redox pair may be properly added to the polymer electrolyte layer used for the present invention. Examples of such components include ionic liquid.

(5) Polymer Electrolyte Layer

The film thickness of the polymer electrolyte layer used for the present invention is preferably within a range of 10 nm to 100 μm, above all within a range of 1 μm to 50 μm, and particularly within a range of 5 μm to 30 μm. The reason therefor is that in the case where the film thickness of the polymer electrolyte layer is less than the above-mentioned range, there is a possibility that the polymer electrolyte layer does not function sufficiently to decrease power generation efficiency of the dye-sensitized solar cell. Also, the reason therefor is that the light scattering function is provided for the polymer electrolyte layer with difficulty. Further, in the case where the film thickness of the polymer electrolyte layer is more than the above-mentioned range, the dye-sensitized solar cell of the present invention is formed into a thin film with difficulty.

The polymer electrolyte layer is not particularly limited if the redox pair does not leak from the polymer electrolyte layer so that the dye-sensitized solar cell of the present invention may be produced or used under the high-temperature atmosphere. The presence or absence of leakage of the redox pair from the polymer electrolyte layer may be examined in such a manner that the polymer electrolyte layer is formed on a glass substrate and thereafter placed at a temperature under the above-mentioned high-temperature atmosphere for a predetermined time to observe a state of the polymer electrolyte layer.

With regard to the transparency of the polymer electrolyte layer, in the present invention, transmittance of light with a wavelength of 400 nm to 800 nm is preferably 70% or more, and more preferably 80% or more. The reason therefor is that in the case where the transparency of the polymer electrolyte layer is less than the above-mentioned range, there is a possibility that solar light is received with such difficulty as to decrease power generation efficiency of the dye-sensitized solar cell. The transparency of the above-mentioned polymer electrolyte layer is a value measured by a measuring method in conformity to JIS K7361-1:1997.

The light scattering function of the polymer electrolyte layer is not particularly limited if scattering of received solar light or reflected light of the solar light allows the dye-sensitized solar cell of the present invention to effectively utilize solar light.

A forming method for the polymer electrolyte layer is not particularly limited if it may be formed by a predetermined film thickness between the after-mentioned oxide semiconductor electrode substrate and counter substrate so as to contact with the after-mentioned porous layer. The method may be the same as a general method used for producing a dye-sensitized solar cell having a polymer electrolyte layer.

2. Counter Substrate

The counter substrate used for the present invention has the second electrode base material provided with a function as an electrode.

The second electrode base material and the catalyst layer used for the counter substrate are each described hereinafter.

(1) Second Electrode Base Material

At least one of the second electrode base material and the after-mentioned first electrode base material used for the present invention is composed of a base material having transparency.

An embodiment such that the second electrode base material is a base material having transparency (hereinafter regarded as a first embodiment) and an embodiment such that the second electrode base material is a base material having no transparency (hereinafter regarded as a second embodiment) are each described hereinafter.

(a) First Embodiment

The second electrode base material of the embodiment is a base material having transparency. The transparency of the second electrode base material used for the embodiment may be the same as the transparency of the above-mentioned polymer electrolyte layer; therefore, the description herein is omitted.

Specifically, such a second electrode base material has a transparent base material and a transparent electrode layer formed on the transparent base material. The transparent base material and the transparent electrode layer are each described hereinafter.

(i) Transparent Base Material

The transparent base material used for the embodiment is not particularly limited if it has such self-supporting property as may form the after-mentioned transparent electrode layer and be used as the counter substrate. Examples of such a transparent base material include an inorganic transparent base material and a resinous base material. Among them, a resinous base material is preferable by reason of being lightweight, excellent in processability, and capable of decreasing production costs.

Examples of the above-mentioned resinous base material include a polyethylene terephthalate film (PET), a polyethylene naphthalate film (PEN) and a polycarbonate film (PC).

Examples of the above-mentioned inorganic transparent base material include a synthetic quartz base material and a glass substrate.

The thickness of the transparent base material used for the embodiment may be properly selected in accordance with factors such as the use of the above-mentioned dye-sensitized solar cell; preferably, generally within a range of 10 µm to 2000 µm, particularly within a range of 50 µm to 1800 µm, and further within a range of 100 µm to 1500 µm.

(ii) Transparent Electrode Layer

Next, the transparent electrode layer used for the embodiment is described. The transparent electrode layer used for the embodiment is formed on the above-mentioned transparent base material.

A material composing the transparent electrode layer used for the embodiment is not particularly limited if it is a material having transparency and desired conductivity, and a conductive polymeric compound and a metal oxide may be used therefor.

Examples of the above-mentioned metal oxide include $SnO_2$, ITO, $SnO_2$ doped with fluorine (FTO), ZnO, and a compound such that zinc oxide is added to indium oxide (IZO).

On the other hand, examples of the above-mentioned conductive polymeric compound include polythiophene, polyaniline (PA), polypyrrole, polyethylene dioxythiophene (PEDOT) and derivatives thereof. Also, these may be used by mixture of two kinds or more.

The transparent electrode layer used for the embodiment may have a constitution composed of a single layer or a constitution such that plural layers are laminated. Examples of a constitution such that plural layers are laminated include an aspect such that layers composed of materials different in work functions are laminated and an aspect such that layers composed of different metal oxides are laminated.

The thickness of the transparent electrode layer used for the embodiment is not particularly limited if it is within a range of being feasible for desired conductivity in accordance with factors such as the use of the above-mentioned dye-sensitized solar cell. Above all, the thickness of the transparent electrode layer in the embodiment is preferably generally within a range of 5 nm to 2000 nm, and particularly within a range of 10 nm to 1000 nm.

A method for forming the above-mentioned transparent electrode layer on the transparent base material may be the same as a forming method for a general electrode layer; therefore, the description herein is omitted.

(b) Second Embodiment

The second electrode base material of the above-mentioned second embodiment is a base material having no transparency. A base material having at least a metal layer may be used as such a second electrode base material.

Such a second electrode base material may have at least a metal layer, and may be such that the above-mentioned metal layer is a metallic foil and the above-mentioned second electrode base material is composed of the metallic foil, or such that the above-mentioned second electrode base material has a base material and a metal layer. In the embodiment, among them, the above-mentioned second electrode base material is preferably composed of the metallic foil. The reason therefor is that the above-mentioned second electrode base material is easily prepared.

Specific examples of a material for the metallic foil used for the embodiment include copper, aluminum, titanium, chromium, tungsten, molybdenum, platinum, tantalum, niobium, zirconium, zinc, various kinds of stainless steel, and alloy thereof; preferably, titanium, chromium, tungsten, various kinds of stainless steel, and alloy thereof are desirable.

The thickness of the metallic foil is generally preferably within a range of 5 µm to 1000 µm, more preferably within a range of 10 µm to 500 µm, and far more preferably within a range of 20 µm to 200 µm.

(2) Catalyst Layer

The counter substrate used for the present invention is not particularly limited if it has the above-mentioned second electrode base material. In particular, the counter substrate preferably has a catalyst layer.

The catalyst layer used for the present invention is formed on the above-mentioned second electrode base material. Further, in case when the counter substrate used for the present invention has the catalyst layer, in the dye-sensitized solar cell of the present invention, the after-mentioned oxide semiconductor electrode substrate and the above-mentioned counter substrate are disposed such that the after-mentioned porous layer and the above-mentioned catalyst layer are opposed to each other.

The formation of the catalyst layer on the above-mentioned second electrode base material allows the dye-sensitized solar cell of the present invention to be further excellent in power generation efficiency. Examples of such a catalyst layer include an aspect such that Pt is evaporated on the above-mentioned second electrode base material and an aspect such that the catalyst layer is formed from polyethylene dioxythiophene (PEDOT), polyaniline (PA), polypyrrole (PP), derivatives thereof, and a mixture thereof, but yet are not limited thereto.

The film thickness of such a catalyst layer is preferably within a range of 5 nm to 500 nm, above all within a range of 10 nm to 300 nm, and particularly within a range of 15 nm to 100 nm.

3. Oxide Semiconductor Electrode Substrate

Next, the oxide semiconductor electrode substrate used for the present invention is described.

The oxide semiconductor electrode substrate used for the present invention has a first electrode base material provided with a function as an electrode and a porous layer formed on the above-mentioned first electrode base material. The first electrode base material and the porous layer used for the oxide semiconductor electrode substrate are each described hereinafter.

(1) First Electrode Base Material

At least one of the above-mentioned first electrode base material and the above-mentioned second electrode base material is a base material having transparency. Accordingly, in the case where the above-mentioned second electrode base material is a base material having transparency, the above-mentioned first electrode base material may be a base material having transparency or a base material having no transparency. In the case where the above-mentioned second electrode base material is a base material having no transparency, a base material having transparency is used as the above-mentioned first electrode base material.

The case where the above-mentioned first electrode base material is a base material having transparency may be the same as is described in the section of '(a) First embodiment' of the above-mentioned second electrode base material; therefore, the description herein is omitted.

The case where the above-mentioned first electrode base material is a base material having no transparency may be the same as is described in the section of '(b) Second embodiment' of the above-mentioned second electrode base material; therefore, the description herein is omitted.

(2) Porous Layer

Next, the porous layer used for the present invention is described. The porous layer used for the present invention contains a dye-sensitizer-supported fine particle of a metal oxide semiconductor on a surface thereof, formed on the above-mentioned first electrode base material, and contacts with the above-mentioned polymer electrolyte layer. In the case where the first electrode base material is composed of the transparent base material and the transparent electrode layer, the porous layer is formed on an electrode layer such as the transparent electrode layer.

A fine particle of a metal oxide semiconductor and a dye sensitizer used for the porous layer are each described hereinafter.

(i) Fine Particle of Metal Oxide Semiconductor

A fine particle of a metal oxide semiconductor used for the present invention is not particularly limited if it is composed of a metal oxide provided with semiconductor characteristics. Examples of the metal oxide composing the fine particle of a metal oxide semiconductor used for the present invention include $TiO_2$, $ZnO$, $SnO_2$, ITO, $ZrO_2$, $MgO$, $Al_2O_3$, $CeO_2$, $Bi_2O_3$, $Mn_3O_4$, $Y_2O_3$, $NO_3$, $Ta_2O_5$, $Nb_2O_5$ and $La_2O_3$.

Among them, in the present invention, the fine particle of a metal oxide semiconductor composed of $TiO_2$ is used most preferably. The reason therefor is that $TiO_2$ is particularly excellent in semiconductor characteristics.

The average particle diameter of the fine particle of a metal oxide semiconductor used for the present invention is preferably generally within a range of 1 nm to 10 μm, and particularly within a range of 10 nm to 1000 nm.

The average particle diameter of the above-mentioned fine particle of a metal oxide semiconductor signifies a primary particle diameter.

(ii) Dye Sensitizer

A dye sensitizer used for the present invention is not particularly limited if it may absorb light to cause electromotive force. Examples of such dye sensitizer include organic coloring matter or metal complex coloring matter. Examples of the organic coloring matter include coloring matter such as acridine, azo, indigo, chinone, coumarin, melocyanine, phenylxanthene, indoline and carbazole. In the present invention, among these organic coloring matter, coumarin coloring matter is preferably used. Also, ruthenium coloring matter is preferably used as the metal complex coloring matter, and ruthenium bipyridine coloring matter and ruthenium terpyridine coloring matter as a ruthenium complex are used particularly preferably. The reason therefor is that such a ruthenium complex is so wide in a wavelength range of light to be absorbed that a wavelength range of light to be subject to photoelectric conversion may be vastly widened.

(iii) Optional Components

Optional components other than the above-mentioned fine particle of a metal oxide semiconductor may be contained in the porous layer used for the present invention. Examples of the optional components used for the present invention include a resin. The reason therefor is that if a resin is contained in the above-mentioned porous layer, brittleness of the porous layer used for the present invention may be improved.

Examples of the resin used for the porous layer in the present invention include polyvinyl pyrrolidone, ethyl cellulose and caprolactam.

(iv) Others

The thickness of the porous layer used for the present invention may be properly determined in accordance with use of the dye-sensitized solar cell of the present invention, and is not particularly limited. Above all, the thickness of the porous layer in the present invention is preferably generally within a range of 1 μm to 100 μm, and particularly within a range of 3 μm to 30 μm.

4. Dye-Sensitized Solar Cell

The present invention is not particularly limited if at least one of the above-mentioned first electrode base material and the above-mentioned second electrode base material is a base material having transparency; at least the above-mentioned second electrode base material is preferably a base material having transparency. The reason therefor is that: in the dye-sensitized solar cell of the present invention, in the case where solar light is received from the counter substrate side, light transmitted through the above-mentioned polymer electrolyte layer is absorbed in a dye sensitizer in the above-mentioned porous layer, so that the above-mentioned constitution allows the improvement in transparency of the polymer electrolyte layer and the effect by the light scattering function as the characteristics of the present invention to be performed greatly.

A method for producing the dye-sensitized solar cell of the present invention may be the same as a method for producing a general dye-sensitized solar cell. An example of such a producing method is the following producing method. First, a porous layer is formed on a first electrode base material to form an oxide semiconductor electrode substrate, and a polymer electrolyte layer is formed by applying and drying a solid-shaped electrolyte layer material on the porous layer of the above-mentioned oxide semiconductor electrode substrate. Separately, a counter substrate is formed by forming a catalyst layer on a second electrode base material as needed. Next, the oxide semiconductor electrode substrate and the counter substrate are contacted and disposed so that the polymer electrolyte layer and the catalyst layer are opposed to each other, and thereby produce a dye-sensitized solar cell.

Other methods for producing a general dye-sensitized solar cell may be used in the present invention.

B. Dye-Sensitized Solar Cell Module

Next, a dye-sensitized solar cell module of the present invention is described.

A dye-sensitized solar cell module of the present invention is characterized in that a plurality of the dye-sensitized solar cell described in the above-mentioned section of 'A. Dye-sensitized solar cell' is connected.

A dye-sensitized solar cell module of the present invention is described by using the drawing.

Figure 3:
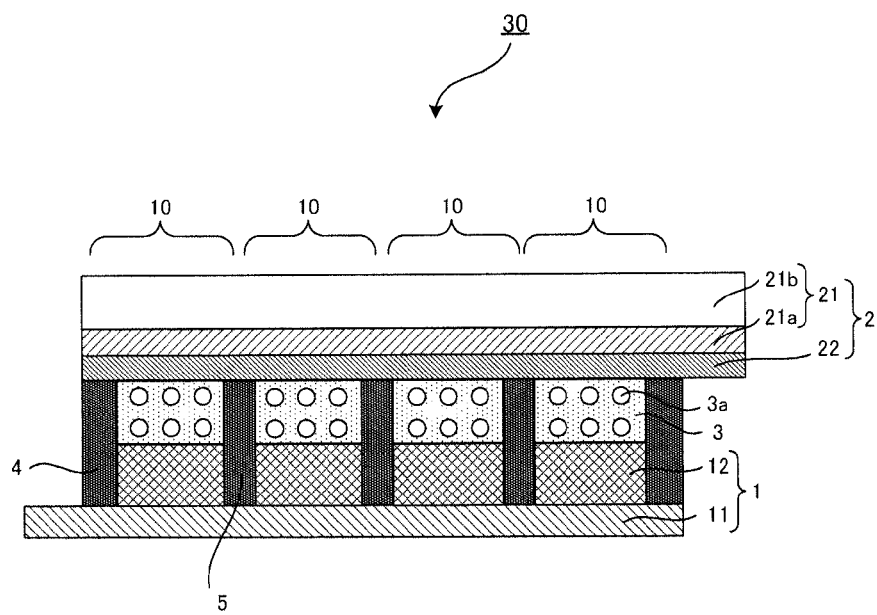
FIG. 3 is a schematic cross-sectional view showing an example of a dye-sensitized solar cell module of the present invention.
Figure 4A:
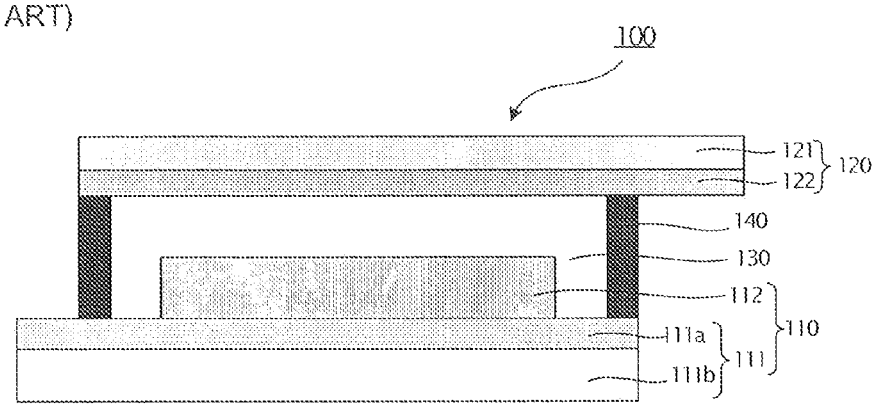
FIGS. 4A and 4B are each a schematic cross-sectional view showing an example of a dye-sensitized solar cell.
Figure 4B:
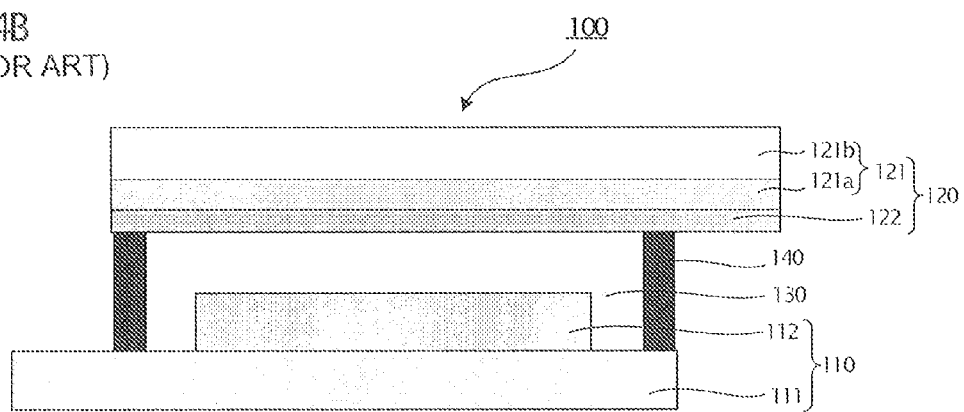

FIG. 3 is a schematic cross-sectional view showing an example of a dye-sensitized solar cell module of the present invention. As shown in FIG. 3, a dye-sensitized solar cell module 30 of the present invention comprises a plurality of a dye-sensitized solar cell 10 connected in parallel, wherein each dye-sensitized solar cell 10 comprises: an oxide semiconductor electrode substrate 1 having: a first electrode base material 11 made of a metallic foil, and a porous layer 12 formed on the first electrode base material 11 and containing a dye-sensitizer-supported fine particle of a metal oxide semiconductor; and a counter substrate 2 having: a second electrode base material 21 having a transparent base material 21b and a transparent electrode layer 21a formed on the transparent base material 21b, and a catalyst layer 22 formed on the transparent electrode layer 21a; and a polymer electrolyte layer 3 formed between the oxide semiconductor electrode substrate 1 and the counter substrate 2 so as to contact with the porous layer 12, in which the oxide semiconductor electrode substrate 1 and the counter substrate 2 are disposed such that the porous layer 12 and the catalyst layer 22 are opposed to each other. In FIG. 3, the polymer electrolyte layer 3 has a transparent fine particle 3a, a polymeric compound and a redox pair. Also, as shown in FIG. 3, the ends of the dye-sensitized solar cell module 30 are generally sealed by a sealing agent 4 and the like, and a partition wall 5 is formed in each gap between the dye-sensitized solar cells 10.

The present invention may provide a high-quality dye-sensitized solar cell module, which is obtained at low costs, by having the above-mentioned dye-sensitized solar cell.

The dye-sensitized solar cell used for the present invention may be the same as was described in the section of 'A. Dye-sensitized solar cell'; therefore, the description herein is omitted.

The sealing agent for sealing the ends of the dye-sensitized solar cell module and the partition wall formed in each gap between the dye-sensitized solar cells may be the same as are used for a general dye-sensitized solar cell module; therefore, the description herein is omitted.

In the present invention, an aspect such that plural dye-sensitized solar cells are connected is not particularly limited if desired electromotive force may be obtained by the dye-sensitized solar cell module of the present invention. Such an aspect may be an aspect such that the individual dye-sensitized solar cells are connected in series or connected in parallel.

The present invention is not limited to the above-mentioned embodiments. The above-mentioned embodiments are exemplification, and any case is included in the technical scope of the present invention if it has substantially the same constitution as the technical idea described in the claim of the present invention and offers similar operation and effect thereto.

EXAMPLES

The present invention is hereinafter described more specifically by using examples.

Example (Production of Oxide Semiconductor Electrode Substrate)

Paste such that 0.5%-ethyl cellulose STD-100™ (manufactured by Nisshin Kasei Co., Ltd.) was mixed into titanium oxide particles P25™ (manufactured by Nippon Aerosil Co., Ltd.) in ethanol was applied and dried on a Ti foil with a thickness of 50 μm (manufactured by Etakeuchi Co., Ltd.) as a first electrode base material, and burned at a temperature of 500° C. for 30 minutes to obtain a porous layer-forming layer with a film thickness of 5 μm. Thereafter, a dye sensitizer solution such that N719 Dye™ (Dyesol) was dissolved by 0.3 mM in acetonitrile/tert-butanol=1/1 solution was prepared, and the above-mentioned Ti foil substrate was immersed in this dye sensitizer solution for 20 hours and dried to thereby obtain an oxide semiconductor electrode substrate.

(Production of Counter Substrate)

An ITO film/PEN substrate with a film thickness of 125 μm was used as a second electrode base material, and Poly(3, 4-ethylenedioxythiophene)poly(stryrenesulfonate) 2% aqueous dispersion and polystyrene particles, Techpolymer™ (manufactured by Sekisui Plastics Co., Ltd.), were added on the ITO film so that the solid ratio became 2:1, applied to the ITO film/PEN substrate so that the coating amount became 0.3 g/m² (solid ratio), and dried at a temperature of 120° C. for 10 minutes to thereby form a catalyst layer and then obtain a counter substrate.

(Production of Electrolyte Layer and Production of Dye-Sensitized Solar Cell)

A redox pair solution such that 6-mol/l hexyl methyl imidazolum iodide (manufactured by Tomiyama Pure Chemical Industries, Ltd.), 6-mol/l$_2$ (manufactured by Merck Ltd.) and 0.45-mol/l n-methyl benzomidazol (manufactured by Sigma-Aldrich Corporation) were dissolved in hexyl methyl imidazolum tetracyanoborat (manufactured by Merck Ltd.) was prepared. Next, a resin solution such that STD-100 (manufactured by Nisshin Kasei Kogyo Co., Ltd.) was dissolved by 10 w % in ethanol was prepared to prepare a resin electrolytic solution such as to mix at the above-mentioned redox pair solution:resin solution=1:6 (weight ratio). An ATO methanol fluid dispersion such that fine particles made of ATO with a transmittance of 85% or more in a visible light range were dispersed into methanol was added thereto to thereby prepare a resin electrolytic solution with transparent fine particles.

The resin electrolytic solution was applied on the above-mentioned oxide semiconductor electrode substrate so that a solid film thickness became 5 μm, and dried in an oven at a temperature of 100° C. for 5 minutes to obtain a polymer electrolyte layer.

Thereafter, the catalyst layer face of the counter substrate and the polymer electrolyte layer face of the above-mentioned oxide semiconductor electrode substrate were stuck together and thermally laminated by a vacuum laminator to thereby obtain a dye-sensitized solar cell.

Comparative Example

A dye-sensitized solar cell was produced in the same manner as Example 1 except for not adding the ATO methanol fluid dispersion to the above-mentioned resin electrolytic solution.

[Evaluations]

With regard to the obtained dye-sensitized solar cells, current-voltage characteristics were measured by using a spectrophotometer CEP-2000™ (manufactured by Bunkoukeiki Co. Ltd.) to calculate conversion efficiency. The results are shown in Table 1.

The observation was performed for leakage of the electrolytic solution from the polymer electrolyte layer in the following manner.

First, the polymer electrolyte of Example and Comparative Example was each formed on a glass substrate and heated at a temperature of 120° C. for 3 minutes. No leakage of the electrolytic solution was observed with regard to the polymer electrolyte layer of Example; however, leakage of the electrolytic solution from the electrolyte layer was observed with regard to the polymer electrolyte layer of Comparative Example.

TABLE 1

|  | Conversion Efficiency (%) | Presence or Absence of Leakage |
|---|---|---|
| Example | 0.83 | Absence |
| Comparative Example | 0.73 | Presence |

What is claimed is:
1. A dye-sensitized solar cell comprising:
an oxide semiconductor electrode substrate having: a first electrode base material made of a base material having a metal layer, and a porous layer formed on the first electrode base material and containing a plurality of fine particles of a metal oxide semiconductor, which support a sensitizing dye and the average particle diameter of which is within a range of 1 nm to 10 μm;
a counter substrate having a second electrode base material having a transparent substrate and a transparent electrode layer formed on the transparent substrate; and
a polymer electrolyte layer formed between the oxide semiconductor electrode substrate and the counter substrate so as to contact with the porous layer, in which the oxide semiconductor electrode substrate and the counter substrate are disposed such that the porous layer and the second electrode base material are opposed to each other,
wherein the polymer electrolyte layer contains a plurality of transparent fine particles, the average particle diameter of which is within a range of 1 nm to 10 μm, a polymeric compound and a redox pair,
wherein the transparent electrode layer is constituted from a metal oxide,
wherein the content of the plurality of transparent fine particles in a solid component of the polymer electrolyte layer is within a range of 1% by mass to 50% by mass,
wherein the plurality of transparent fine particles has conductivity,
wherein a conductive material used for the plurality of transparent fine particles is fluorine-doped tin oxide (FTO), a compound obtained by doping zinc oxide into indium oxide (IZO), antimony trioxide (ATO), polythiophene, polyaniline (PA), polypyrrole, polyethylene dioxythiophene (PEDOT), or a derivative of polythiophene, polyaniline (PA), polypyrrole, or polyethylene dioxythiophene (PEDOT), and
wherein the polymeric compound used for the polymer electrolyte layer is a cellulosic resin.

2. The dye-sensitized solar cell according to claim 1, wherein a refractive index of the plurality of transparent fine particles differs from a refractive index of the polymeric compound.

3. A dye-sensitized solar cell module comprising a plurality of dye-sensitized solar cells connected, wherein each dye-sensitized solar cell comprises:
an oxide semiconductor electrode substrate having: a first electrode base material made of a base material having a metal layer, and a porous layer formed on the first electrode base material and containing a plurality of fine particles of a metal oxide semiconductor, which support a sensitizing dye and the average particle diameter of which is within a range of 1 nm to 10 μm;
a counter substrate having a second electrode base material having a transparent substrate and a transparent electrode layer formed on the transparent substrate; and
a polymer electrolyte layer formed between the oxide semiconductor electrode substrate and the counter substrate so as to contact with the porous layer, in which the oxide semiconductor electrode substrate and the counter substrate are disposed such that the porous layer and the second electrode base material are opposed to each other,
wherein the polymer electrolyte layer contains a plurality of transparent fine particles, the average particle diameter of which is within a range of 1 nm to 10 μm, a polymeric compound and a redox pair,
wherein the transparent electrode layer is constituted from a metal oxide,
wherein the content of the plurality of transparent fine particles in a solid component of the polymer electrolyte layer is within a range of 1% by mass to 50% by mass, wherein the plurality of transparent fine particles has conductivity, and wherein a conductive material used for the plurality of transparent fine particles is fluorine-doped tin oxide (FTO), a compound obtained by doping zinc oxide into indium oxide (IZO), antimony trioxide (ATO), polythiophene, polyaniline (PA), polypyrrole, polyethylene dioxythiophene (PEDOT), or a derivative of polythiophene, polyaniline (PA), polypyrrole, or polyethylene dioxythiophene (PEDOT), and wherein the polymeric compound used for the polymer electrolyte layer is a cellulosic resin.

* * * * *